United States Patent
Lu et al.

(10) Patent No.: US 10,880,467 B2
(45) Date of Patent: Dec. 29, 2020

(54) IMAGE SENSORS WITH PHASE DETECTION AUTO-FOCUS PIXELS

(71) Applicant: OmniVision Technologies, Inc., Santa Clara, CA (US)

(72) Inventors: Chen-Wei Lu, San Jose, CA (US); Yin Qian, Milpitas, CA (US); Dyson Tai, San Jose, CA (US); Chin Poh Pang, Pleasanton, CA (US); Boyang Zhang, San Jose, CA (US); Cheng Zhao, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 16/017,566

(22) Filed: Jun. 25, 2018

(65) Prior Publication Data

US 2019/0394389 A1 Dec. 26, 2019

(51) Int. Cl.
*H04N 5/232* (2006.01)
*H01L 27/146* (2006.01)
*H04N 5/341* (2011.01)

(52) U.S. Cl.
CPC ... *H04N 5/23212* (2013.01); *H01L 27/14621* (2013.01); *H01L 27/14643* (2013.01); *H04N 5/341* (2013.01)

(58) Field of Classification Search
CPC ............... H04N 5/23212; H04N 5/341; H01L 27/14621; H01L 27/14643
See application file for complete search history.

(56) References Cited

U.S. PATENT DOCUMENTS

| 6,583,438 | B1* | 6/2003 | Uchida | G02B 3/0012 |
| | | | | 257/291 |
| 9,432,568 | B2 | 8/2016 | Mlinar et al. | |
| 2016/0231468 | A1* | 8/2016 | Ootsuka | G02B 3/0018 |
| 2017/0084655 | A1* | 3/2017 | Shibuta | G02B 3/0075 |
| 2017/0339353 | A1* | 11/2017 | Banachowicz | H04N 5/369 |
| 2019/0052823 | A1* | 2/2019 | Jung | H04N 5/36961 |

* cited by examiner

*Primary Examiner* — Padma Haliyur

(57) ABSTRACT

An image sensor pixel array comprises a plurality of image pixel units to gather image information and a plurality of phase detection auto-focus (PDAF) pixel units to gather phase information. Each of the PDAF pixel units includes two of first image sensor pixels covered by a shared micro-lens. Each of the image pixel units includes four of second image sensor pixels adjacent to each other, wherein each of the second image sensor pixels is covered by an individual micro-lens. A coating layer is disposed on the micro-lenses and forms a flattened surface across the whole image sensor pixel array to receive incident light.

17 Claims, 5 Drawing Sheets

IMAGE SENSORS WITH PHASE DETECTION AUTO-FOCUS PIXELS

TECHNICAL FIELD

This disclosure relates generally to semiconductor image sensors, and in particular but not exclusively, relates to image sensors with micro-lens (ML) phase detection auto-focus (PDAF) pixels.

BACKGROUND INFORMATION

Image sensors have become ubiquitous. They are widely used in digital still cameras, cellular phones, security cameras, as well as medical, automotive and other applications. Some applications such as automatic focusing and three dimensional (3D) imaging may require electronic devices to provide stereo and/or depth sensing capabilities. Such image sensor devices usually include both image pixels and phase detection auto-focus (PDAF) pixels in a single image sensor. With this type of arrangement, a camera can use the on-chip PDAF pixels to focus an image without requiring a separate phase detection sensor. In a typical arrangement, PDAF pixels all have the same color and are arranged consecutively in a line in the pixel array. When PDAF pixels are arranged in this way, optical crosstalk becomes problematic. For example, optical cross talk between a green image pixel and a green PDAF pixel may be more difficult to correct than optical cross talk between a green image pixel and a red image pixel. It would therefore be desirable to provide improved PDAF pixel with less optical cross talk.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1:
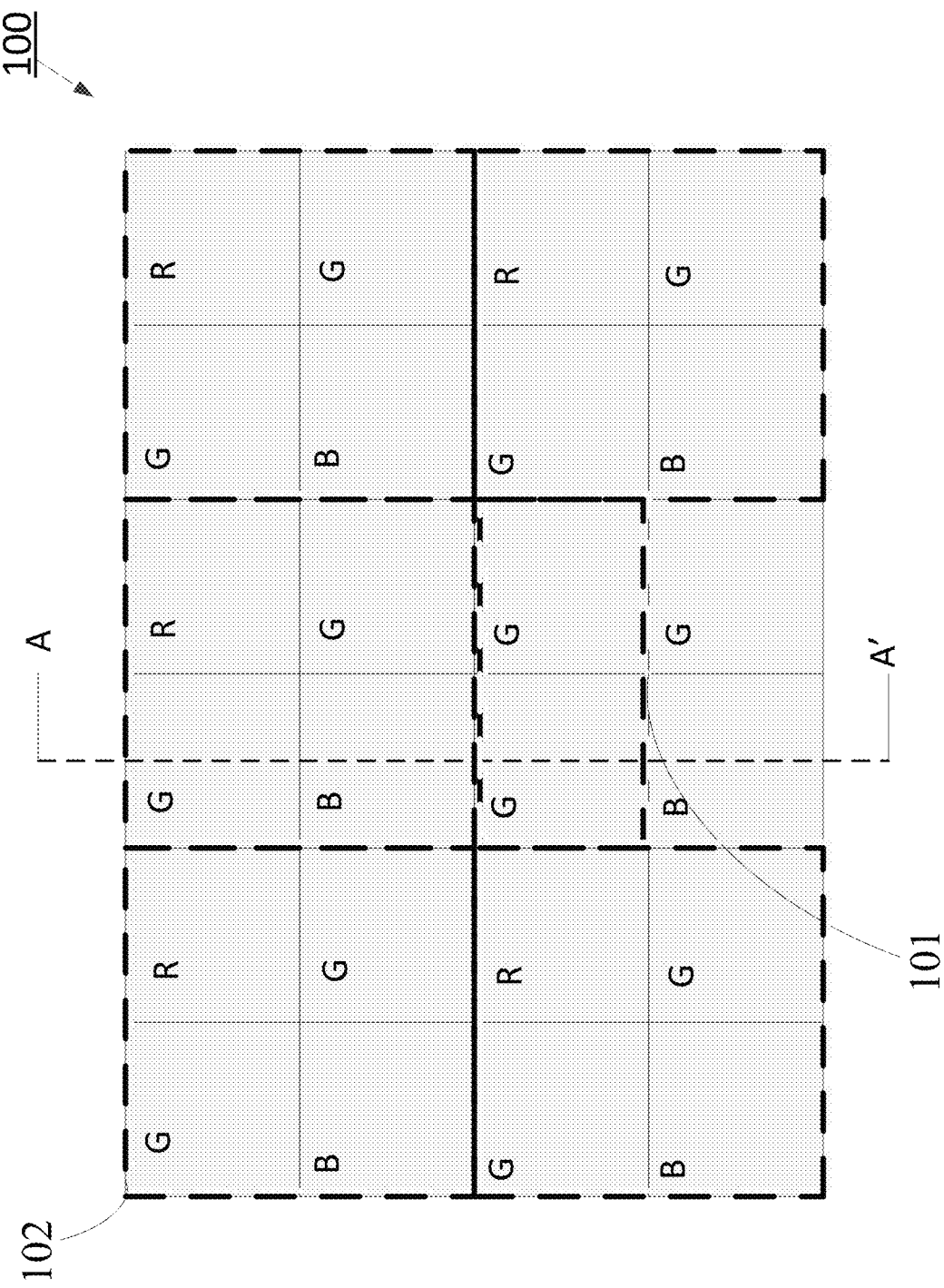
FIG. 1 is a top-down view of an image sensor pixel array with both PDAF pixels and image pixels, in accordance with an embodiment of the invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for an image sensor with both PDAF pixels and image pixels are described herein. In the following description, numerous specific details are set forth to provide a thorough understanding of the examples. However, one skilled in the relevant art will recognize that the techniques described herein can be practiced without one or more of the specific details, or with other methods, components, materials, etc. In other instances, well-known structures, materials, or operations are not shown or described in details in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meanings.

FIG. 1 is a top-down view of an image sensor pixel array 100 comprising a plurality of image pixel units 102 to gather image information and a plurality of phase detection auto-focus (PDAF) pixel units 101 to gather phase information, in accordance with an embodiment of the invention. Each of the PDAF pixel units 101 includes two of first image sensor pixels adjacent to each other and arranged with a two-by-one pattern which is distributed across the whole image sensor pixel array to collect phase information with various angular responses. Each of the image pixel units 102 includes four of second image sensor pixels adjacent to each other and arranged with a two-by-two pattern which is repeated across the whole image sensor pixel array to collect image information. Each of the first image sensor pixels includes a first photodiode (PD) disposed in a semiconductor substrate 212. Each of the second image sensor pixels includes a second PD disposed in the semiconductor substrate 212, wherein the second PD may be identical as the first PD. Each of the PDAF pixel units 101 may be substantially or completely surrounded by image pixel units 102.

As depicted in FIG. 1, the image sensor pixel array 100 also includes a color filter array. Anyone of the first image sensor pixels and the second image sensor pixels marked with an R includes a red color filter, marked with a G includes a green color filter, and marked with a B includes a blue color filter. The color filters in the image pixel units 102 is a Bayer mosaic pattern which includes two green second image pixels arranged on one diagonal and one red and one blue second image pixel arranged on the other diagonal. The use of red, green, and blue color filters in FIG. 1 is merely illustrative. If desired, the color filter patterns may include broadband filters, too. For example, each two-by-two image pixel unit 102 may include one pixel having a broadband filter. In general, any suitable color filter pattern and any suitable type of color filter may be used in image sensor pixel array 100. As an example in FIG. 1, the color filters in the PDAF pixel units 101 are formed with same green color filters, which disrupt the Bayer mosaic patterns of pixel array 100. The color filters in the PDAF pixel units 101 may also be formed with different color filters, which may not disrupt the Bayer mosaic patterns of pixel array 100.

Figure 2:
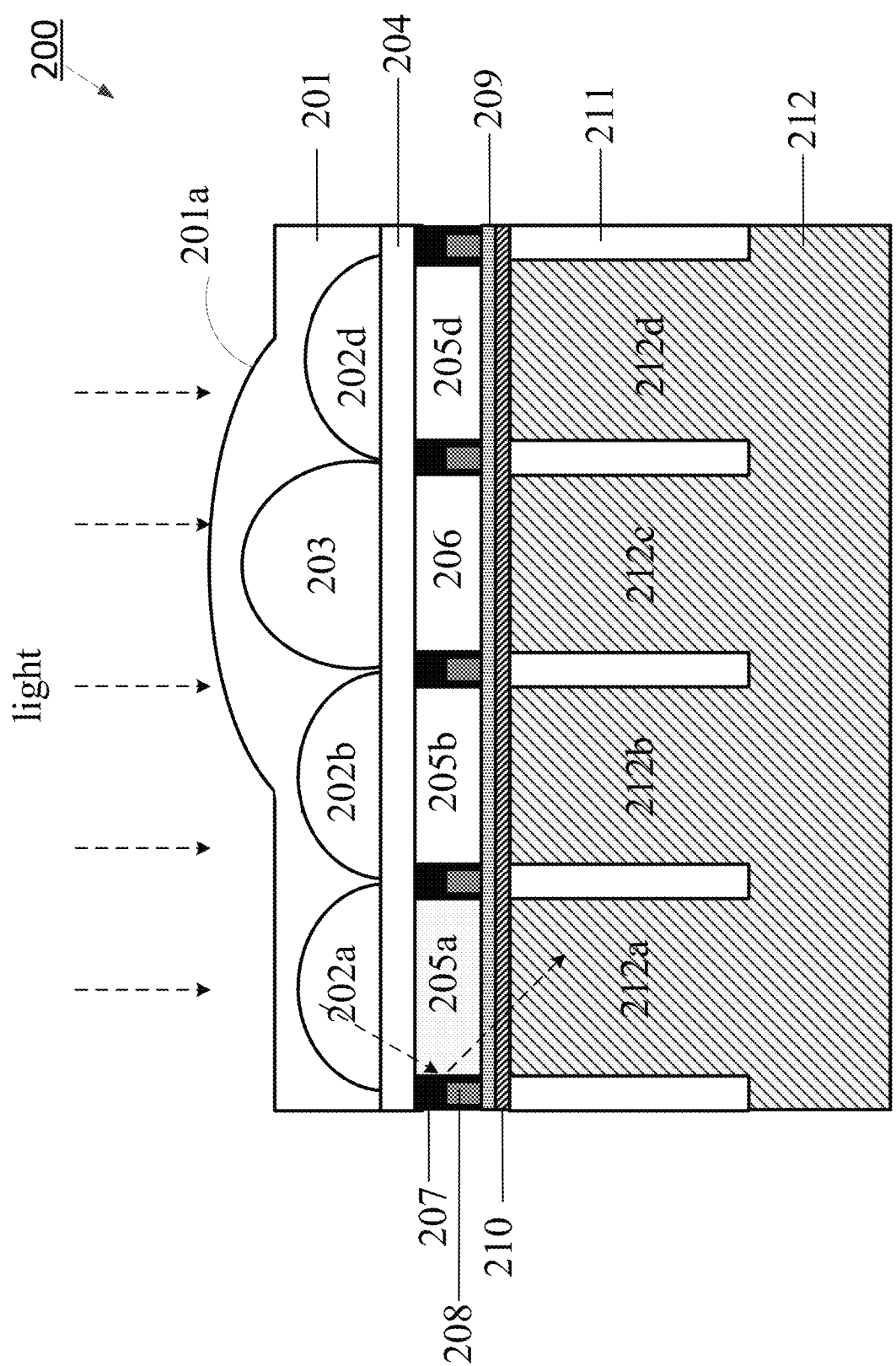
FIG. 2 is a cross-sectional view of the image sensor pixel array in FIG. 1 along A-A' direction, in accordance with an embodiment of the invention.

As a depicted example, FIG. 2 is a cross-sectional view of the imaging sensor pixel array 200 along A-A' direction in FIG. 1, in accordance with an embodiment of the invention. PD 212c is disposed in the semiconductor substrate 212 and is one of the two adjacent first PDs in a PDAF pixel unit 101 in FIG. 1. PD 212a, 212b and 212d are three second PDs in two image pixel units 102 which are adjacent to a PDAF pixel unit 101. As an example, the first and second photo-diodes (PD) maybe identical and adjacent to each other and electrically/optically isolated by an isolation region 211 in between. The isolation region 211 may be formed by a diffusion isolation region or a trench isolation region. A high k dielectric layer 210 and a first interlayer dielectric layer 209 are disposed on the semiconductor substrate 212. The high k dielectric layer 210 is used to form a P+ pinning layer on the semiconductor substrate 212 in order to reduce the hot electron induced dark current.

As a depicted example in FIG. 2, a color filter array is disposed on the first interlayer dielectric layer 209, wherein each of color filters is aligned with one PD underneath of the color filter. As an example, color filter 205a is a green color filter aligned with PD 212a, color filter 205b is a blue color filter aligned with PD 212b, color filter 205d is a blue color filter aligned with PD 212d, and color filter 206 is a green color filter aligned with PD 212c. The color filters are adjacent to each other and separated by a metal grid in between. The metal grid comprises a reflective layer 208 and a dielectric layer 207. The reflective layer 208 comprises at least one of Al, Cr, Mo and Ti, and is used to reflect incident lights into the respective PD region in order to reduce the optical cross talk between adjacent PDs. The dielectric layer 207 covers the reflective layer 208 to improve the adhesion between the reflective layer 208 and the color filters. The dielectric layer 207 comprises silicon oxide and silicon nitride.

As a depicted example in FIG. 2, a second interlayer dielectric layer 204 is disposed on the color filter array to protect the color filters. A micro-lens array is disposed on the second interlayer dielectric layer 204 and on an illuminated side of the image sensor 200. Each PD in the image pixel units 102 is aligned with an individual second micro-lens, and each pair of PDs in the PDAF pixel units 101 is aligned with a shared first micro-lens. As an example, a second micro-lens 202a is aligned with PD 212a, a second micro-lens 202h is aligned with PD 212b, and a second micro-lens 202d is aligned with PD 212d. The second micro-lenses 202a, 202b and 202d have the uniform size. The first micro-lens 203 is aligned with both. PD 212c and its adjacent PD (not shown in FIG. 2) in the same PDAF pixel unit 101. Because the first micro-lens 203 covers two PDs but the second micro-lens 202a/202b/202d covers only one PD, the first micro-lens 203 is bigger and taller than the second micro-lenses 202a/202b/202d. As an example, a refractive index of the second interlayer dielectric layer 204 is not lower than a refractive index of the first micro-lens 203 and a refractive index of the second micro-lens 202a/202b/202d.

As a depicted example in FIG. 2, all micro-lenses 202a/202b/202d/203 are covered by a first coating layer 201 with a refractive index lower than a refractive index of the micro-lenses 202a/202b/202d/203. As one example, the refractive index of the micro-lenses 202a/202b/202d/203 is approximately 1.66 while the refractive index of the first coating layer 201 is approximately 1.25. Because the first micro-lens 203 is bigger and taller than the second micro-lens 202a/202b/202d, the first coating layer 201 is disposed by following the shape of the first micro-lens 203 and consequently forms a non-flattened surface 201a across the whole micro-lens array. Such non-flattened surface 201a may cause undesirable optical cross talk between adjacent PDs, and degrade the optical performance of the image sensor.

Figure 3:
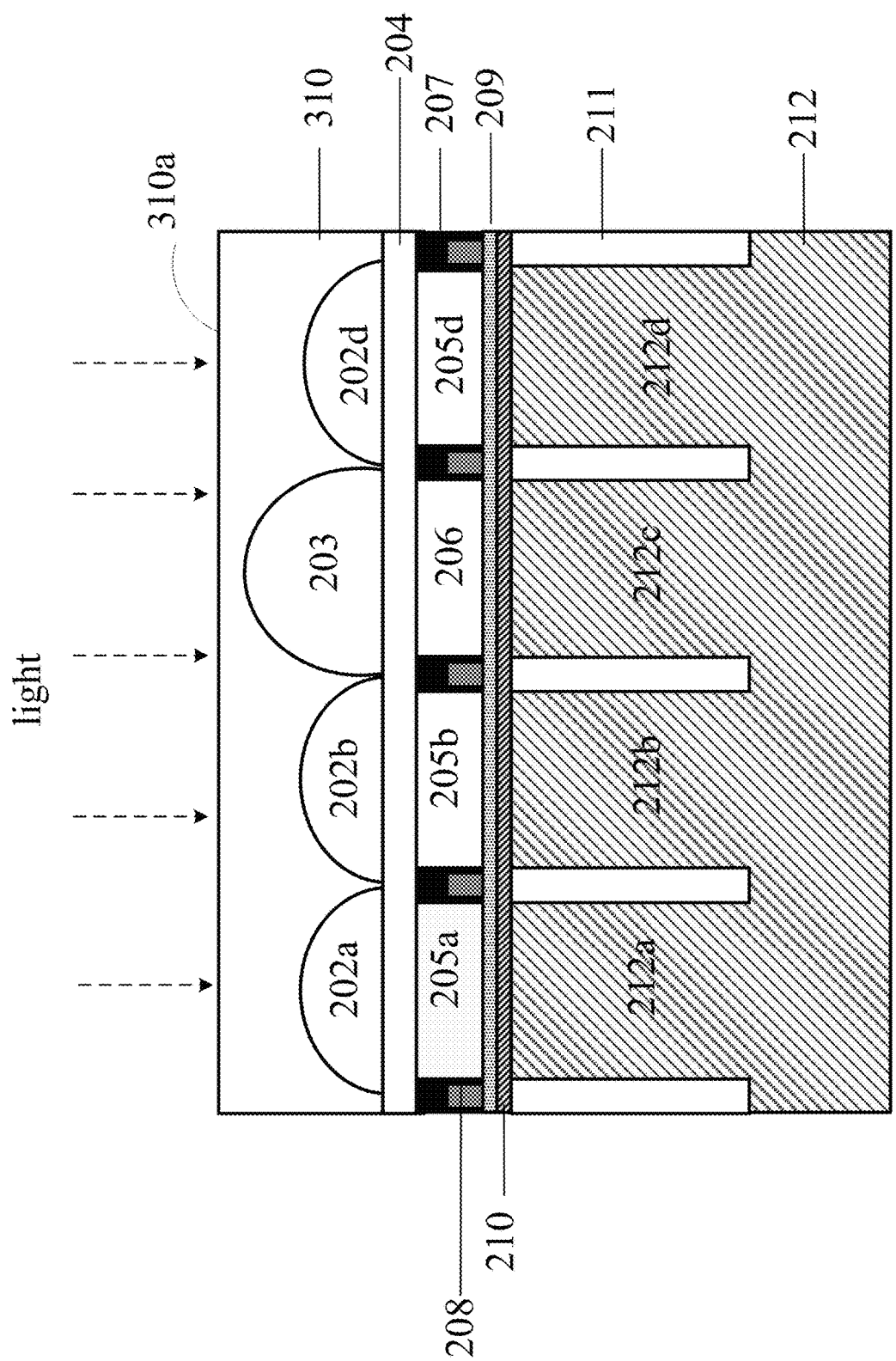
FIG. 3 is a cross-sectional view of the image sensor pixel array in FIG. 1 along A-A' direction, in accordance with an embodiment of the invention.

In order to eliminate the non-flattened surface 201a across the whole micro-lens array, a second coating layer 310 is disposed on the top of the whole micro-lens array and then followed by a flattening process to form a flattened surface 310a across the whole micro-lens array (FIG. 3). The flattening process may be a chemical mechanism polishing (CMP), a wet etch, a dry etch or any combination of these process steps. The second coating layer 310 comprises the same material as the first coating layer 201.

Figure 4:
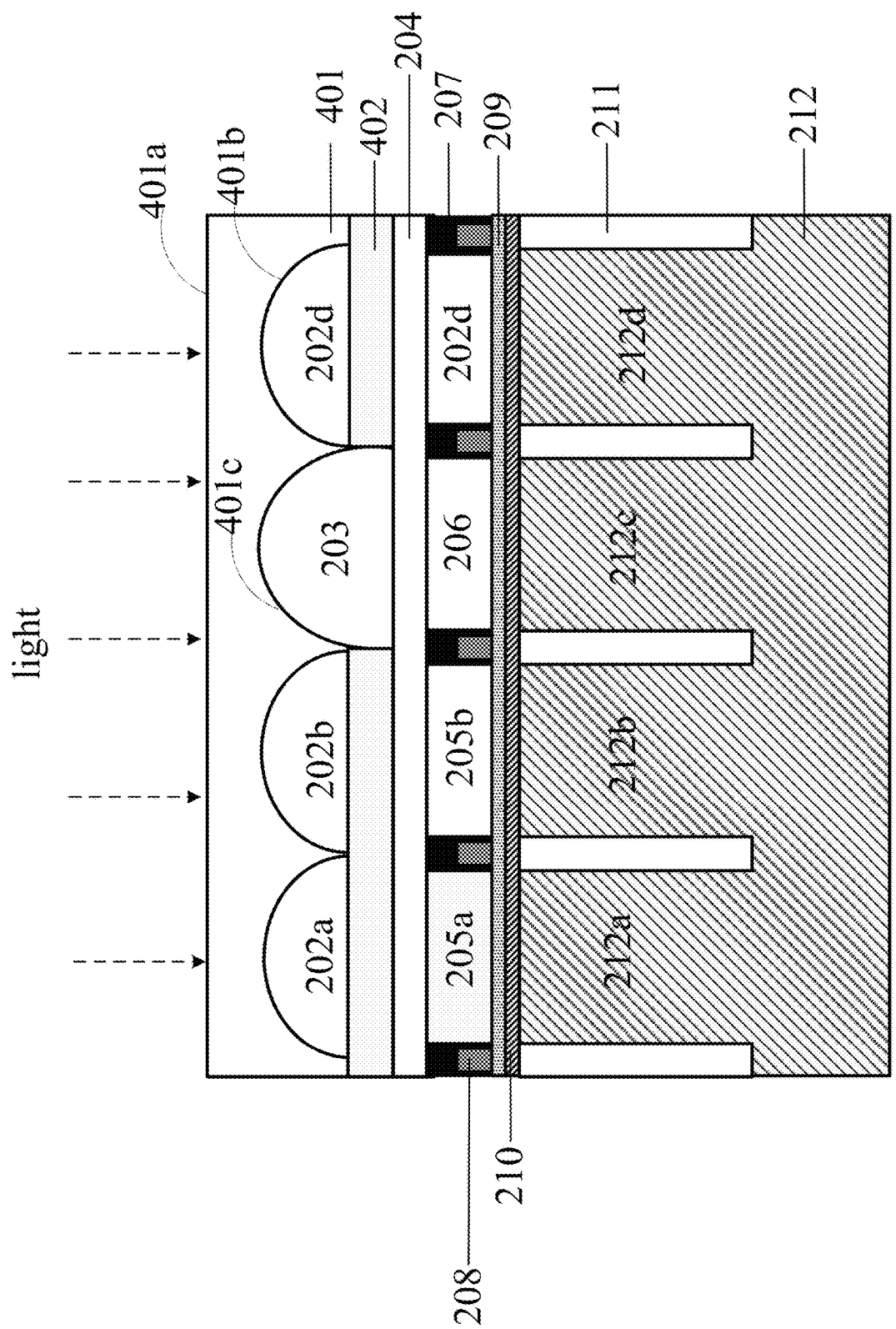
FIG. 4 is a cross-sectional view of the image sensor pixel array in FIG. 1 along A-A' direction, in accordance with an embodiment of the invention.

As an example in FIG. 4, the second micro-lenses 202a/202b and 202d may also be disposed on the surface of a third interlayer dielectric layer 402 which is disposed on the surface of the second interlayer dielectric layer 204. As an example, a refractive index of the third interlayer dielectric layer 402 is not higher than a refractive index of the first micro-lens 203 and a refractive index of the second micro-lens 202a/202b/202d. The first micro-lens 203 is still disposed on the surface of the second interlayer dielectric layer 204. The third interlayer dielectric layer 402 has a thickness matching the height difference between the first micro-lens 203 and the second micro-lenses 202a/202b/202d. As a result, when a third coating layer 401 is disposed on the whole micro-lens array, a top surface 401b of the second micro-lens 202a/202b/202d is at the same level as a top surface 401c of the first micro-lens 203. As a result, a flat surface 401a may be formed across the whole micro-lens array. The third coating layer 401 comprises the same material as the first coating layer 201 in FIG. 2.

Figure 5:
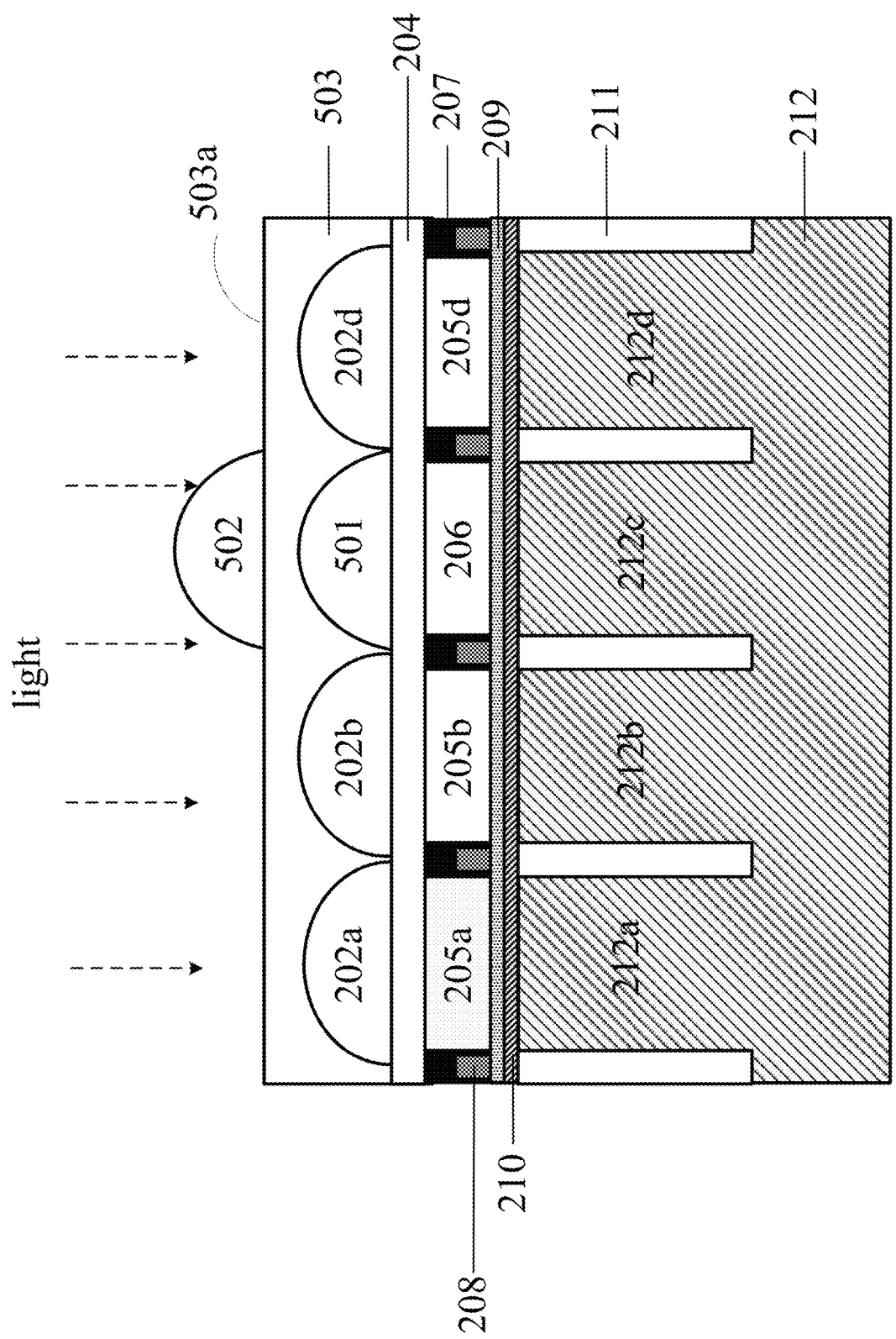
FIG. 5 is a cross-sectional view of the image sensor pixel array in FIG. 1 along A-A' direction, in accordance with an embodiment of the invention.

As an example in FIG. 5, the first micro-lens 203 in FIG. 2 for PDAF pixel units is replaced by a fourth micro-lens 501 and a third micro-lens 502. The fourth micro-lens 501 comprises the same material as the second micro-lens 202a/202b/202d, and has the same size as the second micro-lens 202a/202b/202d. Since the micro-lens 202a/202b/202d and 501 are uniform, a flat surface 503a could be formed when a fourth coating layer 503 is disposed on the micro-lens array. The fourth coating layer 503 comprises the same material as the first coating layer 201 in FIG. 2. The third micro-lens 502 is disposed on the flat surface 503a and aligned with the fourth micro-lens 501. The incident light is focused by the third micro-lens 502 first and then the fourth micro-lens 501. The final focused incident light reaches the same PD region 212c in the semiconductor substrate 212 but with less optical cross talk compared to the incident light focused by the first micro-lens 203 only in FIG. 2. In an example, a refractive index of the third micro-lens 502 may be lower than the refractive index of the fourth coating layer 503.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize. These modifications can be made to the invention in light of the above detailed description. The terms used in the following claims should not be construed to limit the invention to the specific examples disclosed in the specification.

Rather, the scope of the invention is to be determined entirely by the following claims, which are to be construed in accordance with established doctrines of claim interpretation.

What is claimed is:

1. An image sensor pixel array, comprising:
   a plurality of image pixel units to gather image information; and
   a plurality of phase detection auto-focus (PDAF) pixel units to gather phase information, wherein:
   each of the PDAF pixel units is substantially surrounded by the image pixel units;
   each of the PDAF pixel units includes two first image sensor pixels adjacent to each other, wherein:
   each of the first image sensor pixels includes a first photodiode disposed in a semiconductor substrate; and
   a shared first micro-lens covers both of the first image sensor pixels;
   each of the image pixel units includes four second image sensor pixels adjacent to each other, wherein:
   each of the second image sensor pixels includes a second photodiode disposed in the semiconductor substrate and is covered by an individual second micro-lens wherein the first micro-lens is bigger and taller than the second micro-lens; and
   a coating layer disposed on both the first micro-lenses and the second micro-lenses, wherein the coating layer forms a flattened surface across the whole image sensor pixel array to receive incident light;
   wherein a refractive index of the coating layer is lower than a refractive index of the first micro-lenses and a refractive index of the second micro-lenses.

2. The image sensor pixel array of claim 1, further comprising:
   a second interlayer dielectric layer covering both the first image sensor pixels and the second image sensor pixels; and
   a third interlayer dielectric layer covering the second image sensor pixels only, wherein:
   the third interlayer dielectric layer is disposed directly on the second interlayer dielectric layer;
   the first micro-lens is disposed directly on the second interlayer dielectric layer;
   the second micro-lens is disposed directly on the third interlayer dielectric layer; and
   a top surface of the second micro-lens is at the same level as a top surface of the first micro-lens.

3. The image sensor pixel array of claim 2, wherein a refractive index of the second interlayer dielectric layer is not lower than a refractive index of the first micro-lens and a refractive index of the second micro-lens.

4. The image sensor pixel array of claim 3, wherein a refractive index of the third interlayer dielectric layer is not higher than the refractive index of the second interlayer dielectric layer and is also not lower than the refractive index of the second micro-lens and the refractive index of the first micro-lens.

5. The image sensor pixel array of claim 3, wherein a refractive index of the coating layer is lower than the refractive index of the first micro-lens and the refractive index of the second micro-lens.

6. The image sensor pixel array of claim 1, wherein the four the second image sensor pixels in each of the image pixel units are arranged to form a 2×2 pattern that is repeated across the whole image sensor pixel array.

7. The image sensor pixel array of claim 1, wherein the two the first image sensor pixels in each of the PDAF pixel units are arranged to form a 2×1 pattern distributed across the whole image sensor pixel array to collect phase information with various angular responses.

8. The image sensor pixel array of claim 1, wherein the first photodiode in the first image sensor pixel is the same as the second photodiode in the second image sensor pixel.

9. An image sensor pixel array, comprising:
   a plurality of image pixel units to gather image information; and
   a plurality of phase detection auto-focus (PDAF) pixel units to gather phase information, wherein:
   each of the PDAF pixel units is substantially surrounded by the image pixel units;
   each of the PDAF pixel units includes two of first image sensor pixels adjacent to each other, wherein:
   each of the first image sensor pixels includes a first photodiode disposed in a semiconductor substrate and is covered by an individual fourth micro-lens; and
   a shared third micro-lens covers both of the fourth micro-lenses;
   each of the image pixel units includes four second image sensor pixels adjacent to each other, wherein:
   each of the second image sensor pixels includes a second photodiode disposed in the semiconductor substrate and is covered by an individual second micro-lens; and
   a coating layer disposed on both the fourth micro-lenses and the second micro-lenses and between the third micro-lenses and the fourth micro-lenses, wherein the coating layer forms a flattened surface across the whole image sensor pixel array to receive incident light.

10. The image sensor pixel array of claim 9, further comprising an interlayer dielectric layer covering both the first image sensor pixels and the second image sensor pixels wherein the fourth micro-lenses and the second micro-lenses are disposed directly on the interlayer dielectric layer.

11. The image sensor pixel array of claim 10, wherein a refractive index of the interlayer dielectric layer is not lower than a refractive index of the fourth micro-lens and a refractive index of the second micro-lens.

12. The image sensor pixel array of claim 9, wherein a refractive index of the coating layer is lower than a refractive index of the fourth micro-lens and a refractive index of the second micro-lens.

13. The image sensor pixel array of claim 9, wherein the four the second image sensor pixels in each of the image pixel units are arranged to form a 2×2 pattern that is repeated across the whole image sensor pixel array.

14. The image sensor pixel array of claim 9, wherein the two the first image sensor pixels in each of the PDAF pixel units are arranged to form a 2×1 pattern distributed across the whole image sensor pixel array to collect phase information with various angular responses.

15. The image sensor pixel array of claim 9, wherein the first photodiode in the first image sensor pixel is the same as the second photodiode in the second image sensor pixel.

16. The image sensor pixel array of claim 9, wherein the fourth micro-lens in the first image sensor pixel is the same as the second micro-lens in the second image sensor pixel.

17. The image sensor pixel array of claim 12, wherein a refractive index of the third microlens is lower than the refractive index of the coating layer.

* * * * *